United States Patent
Sheng et al.

(10) Patent No.: US 7,248,988 B2
(45) Date of Patent: Jul. 24, 2007

(54) SYSTEM AND METHOD FOR REDUCING TEMPERATURE VARIATION DURING BURN IN

(75) Inventors: Eric Chen-Li Sheng, San Jose, CA (US); David H. Hoffman, Sunnyvale, CA (US); John Laurence Niven, Livermore, CA (US)

(73) Assignee: Transmeta Corporation, Santa Clara, CA (US)

( * ) Notice: Subject to any disclaimer, the term of this patent is extended or adjusted under 35 U.S.C. 154(b) by 131 days.

(21) Appl. No.: 10/791,099

(22) Filed: Mar. 1, 2004

(65) Prior Publication Data

US 2005/0192773 A1 Sep. 1, 2005

(51) Int. Cl.
*G06F 15/00* (2006.01)
(52) U.S. Cl. ...................................... 702/132
(58) Field of Classification Search ............... 702/117, 702/64, 129–132; 327/545; 324/765, 755, 324/201, 760, 754; 318/806; 438/15; 714/724
See application file for complete search history.

(56) References Cited

U.S. PATENT DOCUMENTS

| | | | |
|---|---|---|---|
| 5,119,337 A | 6/1992 | Shimizu et al. | 365/201 |
| 5,406,212 A | 4/1995 | Hashinaga et al. | 324/760 |
| 5,844,429 A | 12/1998 | Cho | 327/68 |
| 6,035,407 A | 3/2000 | Gebara et al. | 713/300 |
| 6,037,792 A | 3/2000 | McClure | 324/760 |
| 6,100,751 A | 8/2000 | De et al. | 327/534 |
| 6,104,061 A | 8/2000 | Forbes et al. | 257/330 |
| 6,114,866 A | 9/2000 | Matsuo et al. | 324/760 |
| 6,137,301 A | 10/2000 | Chen | 324/760 |
| 6,157,201 A | 12/2000 | Leung, Jr. | 324/760 |
| 6,218,892 B1 | 4/2001 | Soumyanath et al. | 327/537 |
| 6,262,588 B1 | 7/2001 | Chen | 324/765 |
| 6,310,485 B1 | 10/2001 | McClure | 324/760 |
| 2002/0186031 A1 | 12/2002 | Pelissier | |
| 2003/0001604 A1 | 1/2003 | Pullen et al. | |
| 2003/0001605 A1 | 1/2003 | Jones et al. | |
| 2004/0083075 A1* | 4/2004 | Fan | 702/129 |
| 2004/0108867 A1* | 6/2004 | Butler | 324/765 |
| 2004/0111231 A1* | 6/2004 | Ando | 702/117 |
| 2004/0183588 A1* | 9/2004 | Chandrakasan et al. | 327/545 |
| 2005/0088137 A1* | 4/2005 | Cohen et al. | 318/806 |
| 2005/0240844 A1* | 10/2005 | Pullen et al. | 714/724 |

FOREIGN PATENT DOCUMENTS

EP 0 252 753 1/1988

* cited by examiner

*Primary Examiner*—John Barlow
*Assistant Examiner*—Xiuqin Sun

(57) ABSTRACT

Systems and methods for reducing temperature variation during burn-in testing. In one embodiment, power consumed by an integrated circuit under test is measured. An ambient temperature associated with the integrated circuit is measured. A desired junction temperature of the integrated circuit is achieved by adjusting a body bias voltage of the integrated circuit. By controlling temperature of individual integrated circuits, temperature variation during burn-in testing can be reduced.

29 Claims, 5 Drawing Sheets

SYSTEM AND METHOD FOR REDUCING TEMPERATURE VARIATION DURING BURN IN

RELATED APPLICATION

Co-pending commonly-owned U.S. patent application Ser. No. 10/334,272 filed Dec. 31, 2002, entitled "Diagonal Deep Well Region for Routing Body-Bias Voltage for MOSFETs in Surface Well Regions" to Pelham and Burr, is hereby incorporated herein by reference in its entirety.

FIELD OF THE INVENTION

Embodiments in accordance with the present invention relate to systems and methods for reducing temperature variation during burn in.

BACKGROUND

Highly integrated semiconductor devices, e.g., microprocessors, frequently dissipate a great deal of heat, particularly when operated at elevated temperatures and voltages to screen for defects during burn-in operations. Such heat dissipation is deleterious during burn-in operations, conventionally requiring complex and expensive heat sinking, e.g., water baths and/or liquid metal cooling, and expensive test chambers with very high cooling capacities.

SUMMARY OF THE INVENTION

Therefore, systems and methods for reducing temperature variation during burn-in are highly desired.

Accordingly, systems and methods for reducing temperature variation during burn-in testing are disclosed. In one embodiment, power consumed by an integrated circuit under test is measured. An ambient temperature associated with the integrated circuit is measured. A desired junction temperature of the integrated circuit is achieved by adjusting a body bias voltage of the integrated circuit. By controlling temperature of individual integrated circuits, temperature variation during burn-in testing can be reduced.

In accordance with other embodiments of the present invention, an ambient temperature in a region proximate to an integrated circuit is measured. Electrical power utilized by the integrated circuit is measured. A thermal resistance value for the integrated circuit is accessed and a junction temperature of the integrated circuit id determined without direct measurement of the junction temperature.

DETAILED DESCRIPTION OF THE INVENTION

Figure 1:
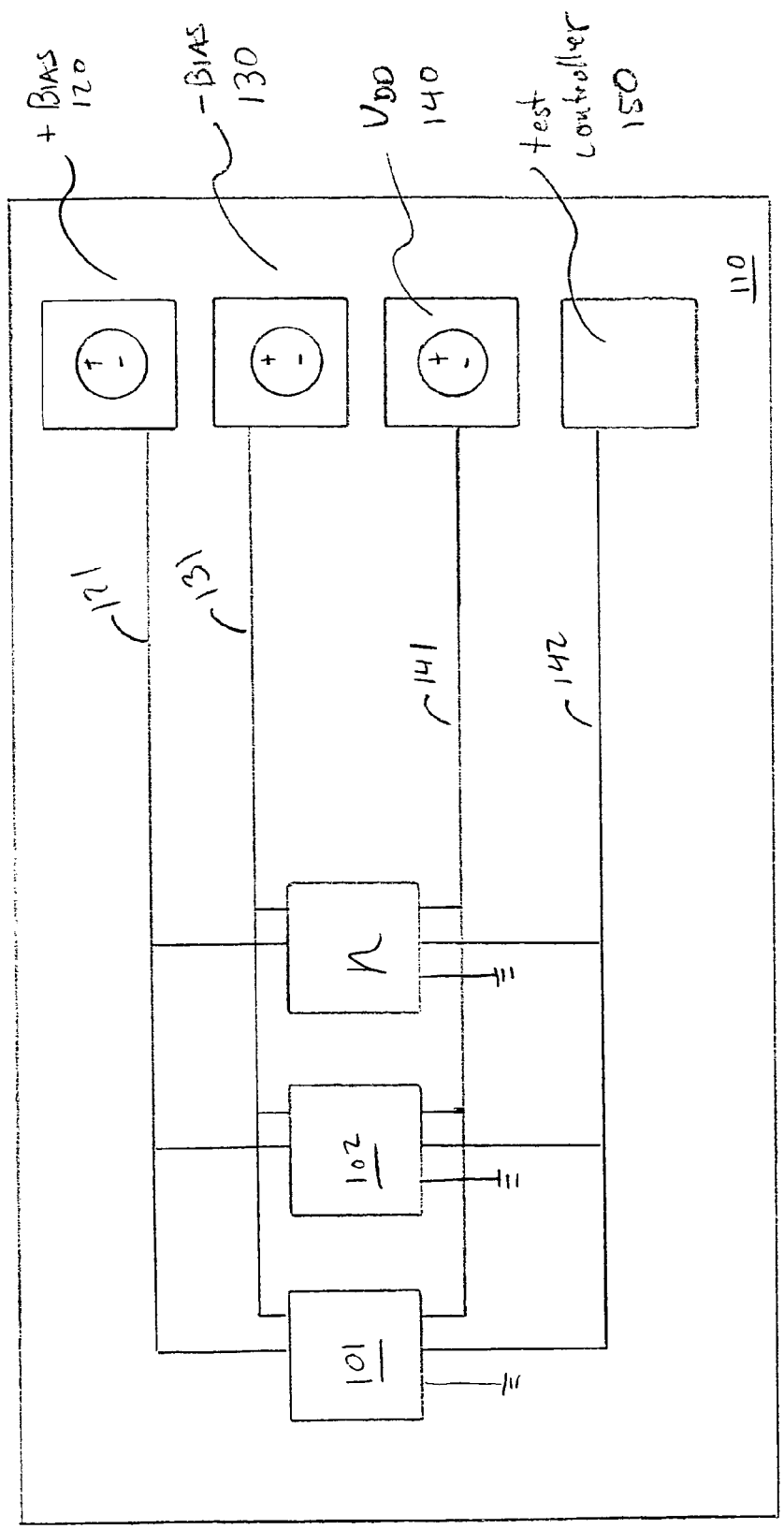
FIG. 1 illustrates an exemplary arrangement of integrated circuit devices configured for a burn-in operation, in accordance with embodiments of the present invention.

In the following detailed description of the present invention, system and method for reducing temperature variation during burn in, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions which follow (e.g., processes 200, 400 and 500) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing" or "dividing" or "computing" or "testing" or "calculating" or "determining" or "storing" or "measuring" or "adjusting" or "generating" or "performing" or "comparing" or "synchronizing" or "accessing" or "retrieving" or "conveying" or "sending" or "resuming" or "installing" or "gathering" or the like, refer to the action and processes of a computer system, or similar electronic computing device" that manipulates and transforms data represented as physical (electronic) quantities within the computer system's registers and memories into other data similarly represented as physical quantities within the computer system memories or registers or other such information storage, transmission or display devices.

System and Method for Reducing Temperature Variation During Burn In

Embodiments in accordance with the present invention are described in the context of design and operation of integrated semiconductors. More particularly, embodiments of the present invention relate to systems and methods for reducing temperature variation during burn-in testing of integrated circuits. It is appreciated, however, that elements of the present invention may be utilized in other areas of semiconductor operation.

Although the following description of embodiments of the present invention will focus on coupling a body-bias voltage to pFETs (or p-type MOSFETS) formed in surface N-wells via a conductive sub-surface region of N-type doping when a p-type substrate and an N-well process are utilized, embodiments in accordance with the present invention are equally applicable to coupling a body-bias voltage to nFETs (or n-type MOSFETS) formed in surface P-wells via a conductive sub-surface region of P-type doping when an n-type substrate and a P-well process are utilized. Consequently, embodiments in accordance with the present invention are well suited to semiconductors formed in n-type materials, and such embodiments are considered within the scope of the present invention.

Burn-in operations to detect integrated circuit defects are generally performed at stressing temperatures, e.g., 150 degrees Celsius, stressing voltages, e.g., 1.5 times nominal operating voltage, and at low operating frequencies, usually orders of magnitude slower than normal operating frequencies. Under these conditions, leakage current tends to dominate power consumption and heat production of the integrated circuit device.

FIG. 1 illustrates an exemplary arrangement 100 of integrated circuit devices configured for a burn-in operation, in accordance with embodiments of the present invention. Arrangement 100 comprises a plurality of integrated circuit devices under test, 101, 102 through N. The integrated circuits may be typically arrayed on a printed wiring board 110, which may include sockets for accepting the integrated circuit devices under test. Because it is desirable to operate the integrated circuit devices under test at a stressing elevated temperature, wiring board 110 is typically placed in a temperature chamber capable of temperature regulation, e.g., adding or removing heat, at high temperatures, e.g., 150 degrees Celsius. A typical burn-in chamber may comprise a plurality of similar wiring boards.

Wiring board 110 comprises a distribution network, e.g., wiring traces, to conduct electrical signals between various power supplies, test controllers and/or instrumentation and the integrated circuit devices under test. Wiring board 110 comprises an operating voltage (Vdd) supply distribution network 141 and a test control distribution network 142. It is appreciated that such wiring networks can be configured in a wide varied of well known networks, including bus, point-to-point, and individual topologies in accordance with embodiments of the present invention.

Operating voltage supply 140 and test controller 150 are shown on wiring board 110. Embodiments in accordance with the present invention are well suited to situating such components elsewhere within a test environment. For example, operating voltage supply 140 is frequently located outside of a thermal chamber, and wired to a connector on wiring board 110. Test control distribution network 142 couples a plurality of signals between test controller 150 and the integrated circuit devices under test. Similarly, operating voltage supply distribution network 141 couples a plurality of signals between operating voltage supply 140 and the integrated circuit devices under test.

A test unit controller, which may or may not be apart of test controller 150, typically stimulates the integrated circuit devices under test with a test pattern sequence and/or test commands and accesses a result. Embodiments in accordance with the present invention are well suited to a wide variety of test unit controllers and testing methods, including, for example, Joint Test Action Group (JTAG) boundary scan and array built-in self test (ABIST).

Operating voltage supply 140 provides voltage and current to operate the integrated circuit devices under test, typically at a stressing voltage, e.g., 1.5 times nominal operating voltage for the integrated circuit devices under test. Current consumption, particularly leakage current consumption, in most semiconductors increases with increasing operating voltage and with increases in operating temperature. Such current increases are generally exponential in nature, e.g., a ten percent increase in operating voltage can cause a 100 percent increase in leakage current consumption. Operating the integrated circuit devices under test at a stressing elevated temperature also greatly increases their current requirements. As a deleterious consequence, operating voltage supply 140 must have a significantly greater current capacity to operate the integrated circuit devices under test in comparison to a current capacity required to operate the same integrated circuit devices under nominal temperature and voltage conditions.

As a typical burn-in configuration can comprise several tens of integrated circuit devices under test per wiring board 110, and numerous wiring boards per chamber, the requirements placed upon operating voltage supply 140 can easily be measured in multiple kilowatts. A precision voltage supply capable of supplying such power and suitable for testing integrated circuit devices can be prohibitively expensive.

Static power consumption in modern semiconductor processes, e.g., processes with a minimum feature size of about 0.13 microns and smaller, is no longer a negligible component of total power consumption. Further, static power, as a percentage of total power, is tending to increase with successive generations of semiconductor process.

For example, maximum operating frequency is generally proportional to the quantity (1−Vt/Vdd), that is, one minus the threshold voltage divided by the supply voltage (for small process geometries). As process geometry shrinks, supply voltage (Vdd) typically also is decreased in order to avoid deleterious effects such as oxide breakdown. Consequently, threshold voltage should also be decreased in order to maintain or increase a desirable maximum operating frequency. Correspondingly, gate oxides are made thinner so that a gate can maintain control of the channel. A thinner gate oxide leads to an increased gate capacitance. Since "off" or leakage current of a CMOS device is generally proportional to gate capacitance, the trend to make gate oxides thinner tends to increase leakage current. As an unfortunate result, the on-going decrease in semiconductor process size also leads to an ever-increasing power consumption deriving from static power dissipation. Further, essentially all of the electrical energy provided by operating voltage supply 140 is converted into heat by the integrated circuit devices under test. As a deleterious effect, for most highly integrated circuits, the integrated circuits under test produce more than enough heat to achieve a desired stress temperature, and the temperature chamber is no longer required to provide such heat. In sharp contrast, the temperature chamber must now be capable of removing vast heat loads, contributing to requirements for a very expensive chamber.

Further, conducting such vast amounts of heat out of the integrated circuit die, through the integrated circuit packaging and into the temperature chamber environment is problematic. Heat dissipation requirements of highly integrated circuits, e.g., microprocessors, generally outpace heat dissipation capabilities of the integrated circuit packaging under burn-in stress conditions. Consequently, very expensive "exotic" heat sinking arrangements, e.g., water baths and liquid metal cooling are conventionally employed to get the heat out of integrated circuits during burn-in testing.

Certain semiconductor devices have beet body biasing well structures to control power consumption during operation. U.S. patent application Ser. No. 10/334,272 incorporated herein by reference and referenced above, describes such devices in more depth. In accordance with embodiments of the present invention, such body biasing well structures can be advantageously utilized during burn-in operations to control particular parameters of a burn-in process.

Still referring to FIG. 1, positive bias voltage generator 120 is coupled to positive bias voltage distribution network 121, which in turn is coupled to the integrated circuits under test. Positive bias voltage generator 120 provides a body-biasing voltage, e.g., zero to five volts, to n type wells disposed beneath pFET devices in the integrated circuit devices under test. Such body biasing enables adjustment of threshold voltages of the pFET devices, for example, to reduce leakage current of the pFET devices.

In a similar manner, negative bias voltage generator 130 is coupled to negative bias voltage distribution network 131, which in turn is coupled to the integrated circuits under test. Negative bias voltage generator 130 provides a body-biasing voltage, e.g., −5 to zero volts, to p type wells disposed beneath nFET devices in the integrated circuit devices under test. Such body biasing enables adjustment of threshold voltages of the nFET devices, for example, to reduce leakage current of the nFET devices.

It is appreciated that such bias voltage distribution networks 121 and 131 can be configured in a wide varied of well known networks, including bus, point-to-point, and individual topologies in accordance with embodiments of the present invention. There may be a plurality of bias generators 120, 130 on wiring board 110, or bias generators may be located off of wiring board 110, in accordance with embodiments of the present invention.

In general, bias voltage generators 120 and 130 are variable voltage sources. Their output voltage can be set (within a range) to a specific value. It is desirable, but not required, that such specific values be set digitally, e.g., by a command from test controller 150. Body biasing currents are typically on the order of low micro amps per integrated circuit. Consequently, bias voltage generators 120 and 130 generally can be relatively small and inexpensive voltage sources.

Figure 2:
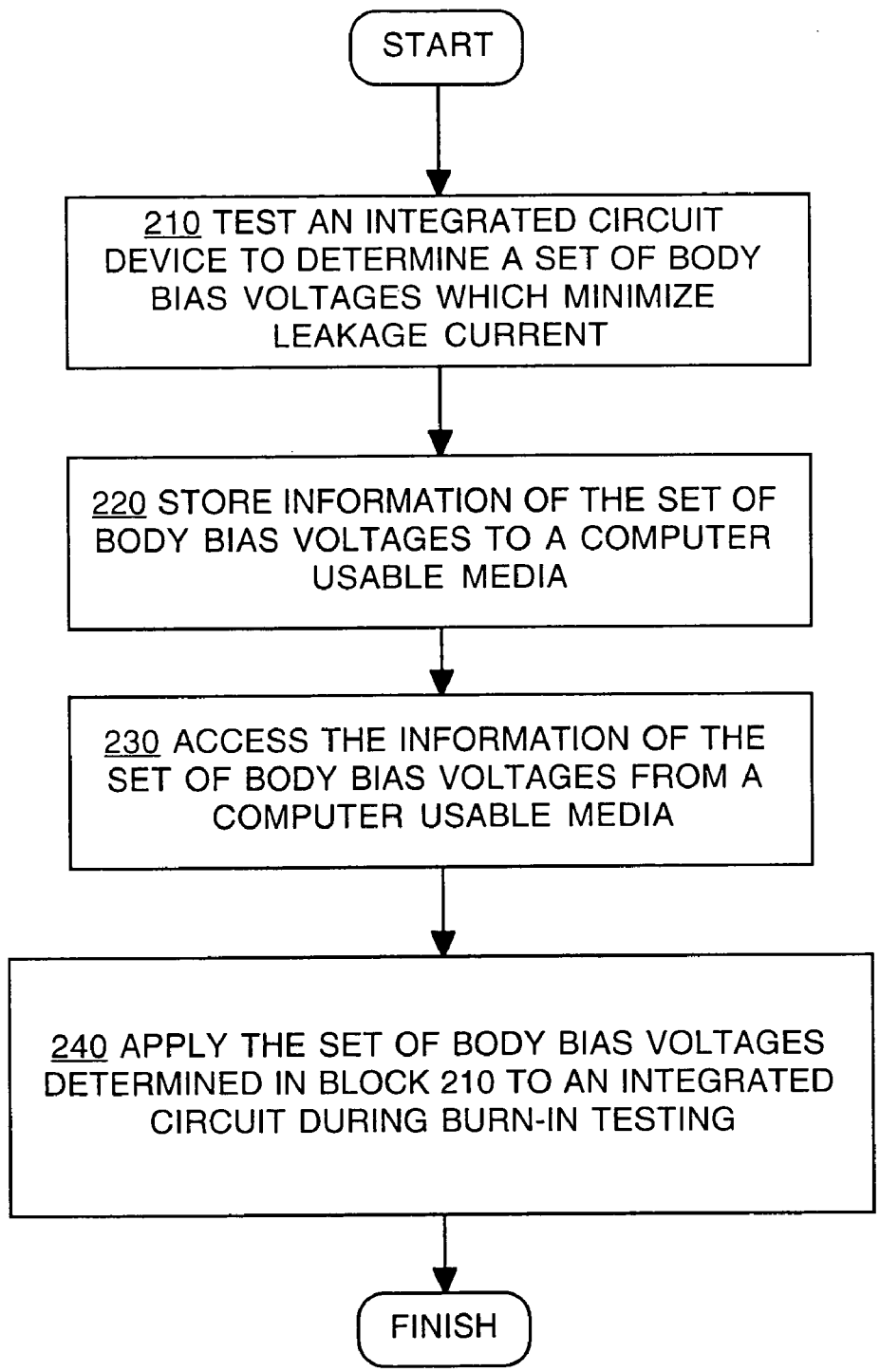
FIG. 2 illustrates a flow chart for a computer-implemented method of reducing power during burn in testing, in accordance with embodiments of the present invention.

FIG. 2 illustrates a flow chart for a computer-implemented method 200 of reducing power during burn in testing, in accordance with embodiments of the present invention. In block 210, an integrated circuit device is tested to determine a set of body bias voltages which minimize leakage current. In general, the testing will determine a unique n well voltage and a unique p well voltage for the integrated circuit device. It is appreciated that integrated circuits with a variety of power domains and body biasing wells are well suited to embodiments in accordance with the present invention.

Advantageously, semiconductor packaging does not affect leakage current; therefore leakage current may be accurately measured on an unpackaged device, e.g., on a wafer tester. As a beneficial consequence, in general, no additional special test equipment or fixturing is required to perform block 210 within a typical semiconductor manufacturing process. Body bias voltages that minimize leakage current will generally be determined outside of a burn-in process, for example during wafer testing. A set of body bias voltages that minimize leakage current may be determined for an entire batch of integrated circuits, e.g., for a wafer or for multiple wafers processes at the same time. Further, embodiments in accordance with the present invention are well suited to determining body bias voltages that minimize leakage current for individual integrated circuits.

In optional block 220, information of the set of body bias voltages, e.g., numerical representations of the voltages, is stored in a computer usable media. As previously described, block 210 and block 240, below, are well suited to being performed on different test equipment, physically separated, e.g., on different continents, at different times, e.g., weeks or months apart. Storing information of the set of body bias voltages enables transmission and/or retrieval of this information for use over distances in time and space.

In optional block 230, information of the set of body bias voltages is accessed from a computer usable media. In accordance with embodiments of the present invention, the computer usable media of block 220 may differ from the computer usable media of block 230. As is well known in the data processing arts, information (data) may be copied and/or transmitted in a variety of ways from media to media. In block 240, the body bias voltages determined in block 210 are applied to an integrated circuit during burn-in testing.

Advantageously, by controlling body bias voltages to minimize leakage current during burn-in processing, power consumption and dissipation of the integrated circuits under test can be reduced by orders of magnitude. As a beneficial consequence of such greatly reduced power consumption, much less capable and much less expensive operating voltage supplies and thermal chambers may be utilized for performing burn-in testing. Alternatively, greater numbers of integrated circuits can be burned in with existing equipment, thereby increasing throughput of a burn-in process. In addition, expensive exotic heat sinking arrangements conventionally utilized with high function integrated circuits are no longer required.

It is desirable to operate each integrated circuit at a specific junction temperature during burn in, for example 150 degrees Celsius. Unfortunately, there will generally be a distribution of junction temperatures, "chip temperatures," in a population of integrated circuits undergoing burn in. For example, most temperature chambers are unable to maintain a precisely uniform ambient temperature at all locations within the chamber. In addition, manufacturing variations among the integrated circuits under test contribute to differences in power consumption, and hence differences in heat output between the various integrated circuits. Consequently, such differences in ambient temperature and heat output contribute to variations in junction temperatures among the integrated circuits under test.

Conventionally, junction temperature variation has been addressed by mechanical temperature control of each integrated circuit, e.g., forcing heat into and drawing heat out of each integrated circuit in order to adjust its junction temperature to the desired temperature. Unfortunately, such conventional individual device temperature control is mechanically complex and expensive. In addition, such structures for externally applied heating and cooling generally have their own relatively large thermal mass, which greatly limits their ability to respond to changes in thermal requirements. Further, the coupling of heating and cooling, as well as temperature measurements, are generally made to integrated circuit packaging, rather than directly to junctions. Consequently, the junction temperature of the integrated circuit is controlled to an undesirable approximation.

Relation 1 below is an approximation of junction temperature of an integrated circuit:

$$T_{junction} = T_{ambient} + P\theta i \quad \text{(Relation 1)}$$

where T is temperature, P is power consumed by the integrated circuit. "θi" is the lumped thermal resistance of the integrated circuit package comprising, for example, a thermal resistance from the integrated circuit to a coupled heatsink to ambient and/or a thermal resistance from the integrated circuit to a circuit board.

It is to be appreciated that the thermal resistance of the integrated circuit package, θi, is highly consistent among similar integrated circuits under test, and can be treated as a constant herein.

It is to be further appreciated that a desire of a burn-in process is to operate the integrated circuits under test at a specific operating voltage, e.g., 1.5 times nominal operating voltage. Current requirements of an integrated circuit, in general, are a function of attributes of that integrated circuit and the voltage applied. Hence, for a desirable specific operating voltage, the power consumed by a particular integrated circuit is essentially fixed for that integrated circuit under the conventional art.

Beneficially, however, in accordance with embodiments of the present invention, power consumption of an integrated circuit can be adjusted by adjusting threshold voltage (s) of the integrated circuit, even if operating voltage of the integrated circuit is held constant. Threshold voltage(s) can be adjusted by adjusting body-bias voltage(s) supplied to body-biasing wells disposed beneath active semiconductors of the integrated circuit. Adjusting threshold voltage(s) of an integrated circuit can make changes in, e.g., increase or decrease, the leakage current of the integrated circuit, which is a significant component of an integrated circuit's power consumption, especially during low frequency operation, for example, during a burn-in process.

In accordance with an embodiment of the present invention, junction temperature of an integrated circuit under test can be controlled by controlling the power consumed by the integrated circuit. The power consumed by the integrated circuit operating at a fixed operating voltage can be controlled by adjusting body biasing voltages to the integrated circuit, which in turn influence leakage current of the integrated circuit.

Figure 3:
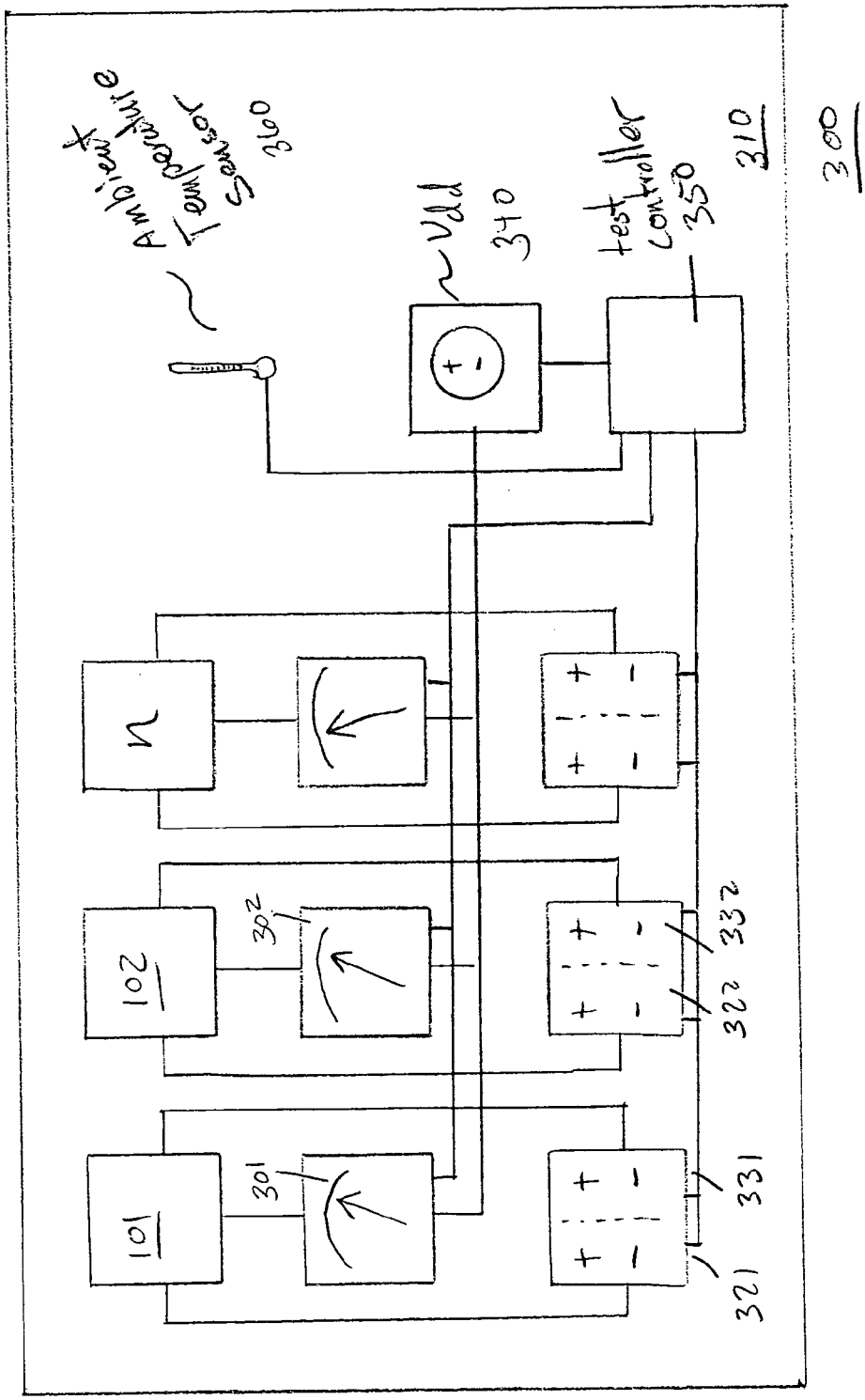
FIG. 3 illustrates an exemplary arrangement of integrated circuit devices configured for a burn-in operation, in accordance with other embodiments of the present invention.

FIG. 3 illustrates an exemplary arrangement 300 of integrated circuit devices configured for a burn-in operation, in accordance with embodiments of the present invention. Arrangement 300 comprises a plurality of integrated circuit devices under test, 101, 102 through N. The integrated circuits are typically arrayed on a printed wiring board 310, which may comprise sockets for accepting the integrated circuit devices under test. Because it is desirable to operate the integrated circuit devices under test at a stressing elevated temperature, wiring board 310 is typically placed in a temperature chamber capable of temperature regulation, e.g., adding or removing heat, at high temperatures, e.g., 150 degrees Celsius. A typical burn-in chamber may comprise a plurality of similar wiring boards.

Wiring board 310 comprises an operating voltage supply 340, which may be similar to operating voltage supply 140. Operating voltage supply 340 provides voltage and current to integrated circuit devices under test 101, 102, etc., though current monitors 301, 302, etc. Operating voltage supply 340 is shown on wiring board 310. Embodiments in accordance with the present invention are well suited to situating such components elsewhere within a test environment. For example, operating voltage supply 340 is frequently located outside of a thermal chamber, and wired to a connector on wiring board 310.

In accordance with embodiments of the present invention, test controller 350 provides significantly more function than test controller 150 (FIG. 1). As will be discussed in more detail below, test controller 350 is coupled to voltage supplies, current measurement devices and ambient temperature sensor(s) in order to measure and control electrical parameters related to power consumption and temperature of the integrated circuit devices under test.

Test controller 350 is desirably located on wiring board 310. However, due to various factors, e.g., the physical size and/or nature of equipment used to implement test controller 350, embodiments in accordance with the present invention are well suited to situating test controller 350 components elsewhere within a test environment, e.g., on a separate wiring board coupled to wiring board 310, or outside of a thermal chamber. For example, if test controller 350 were implemented as a workstation computer, it would generally be impractical to place such a workstation in a thermal chamber due to its size and operating temperature limits.

A test unit controller, which mayor may not be apart of test controller 350, typically stimulates the integrated circuit devices under test with a test pattern sequence and/or test commands and accesses a result. Embodiments in accordance with the present invention are well suited to a wide variety of test unit controllers and testing methods, including, for example, Joint Test Action Group (JTAG) boundary scan and array built-in self test (ABIST).

It is to be appreciated that current monitor 301 measures current supplied to integrated circuit 101, and that current monitor 302 measures current supplied to integrated circuit 102. Each current measurement is reported back to test controller 350, for example via a digital bus. It is appreciated that other wiring arrangements for reporting individual integrated circuit currents are well suited to embodiments in accordance with the present invention.

Test controller 350 is further coupled to operating voltage supply 340, such that test controller 350 has knowledge of the operating voltage supplied to each integrated circuit under test. In general, the operating voltage for each integrated circuit under test will be the same. However, embodiments in accordance with the present invention are well suited to a variety of operating voltages for the integrated circuits under test.

Each integrated circuit under test is coupled to an associated positive and/or negative body-bias voltage source. For example, integrated circuit 101 is coupled to positive body-bias voltage source 321 and negative body-bias voltage source 331. Likewise, integrated circuit 102 is coupled to positive body-bias voltage source 322 and negative body-bias voltage source 332. The body-bias voltage sources are in turn coupled to, and controlled by test controller 350.

With information of the operating voltage and current supplied to each integrated circuit under test, test controller 350 can determine the power consumed by each integrated circuit under test. Ambient temperature sensor 360 provides an ambient temperature measurement to test controller 350. There can be a plurality of ambient temperature sensors associated with wiring board 310. For example, one ambient temperature sensor per wiring board 310 provides a good approximation of the ambient temperature for integrated circuits under test on wiring board 310. Alternatively, there could be an ambient temperature sensor associated with, and in proximity to, each integrated circuit under test on wiring board 310.

Advantageously, it is generally less complex and less expensive to measure ambient temperature than to directly measure junction temperature of the integrated circuits under test. The number of ambient temperature sensors utilized can be adjusted based upon cost constraints, accuracy requirements and understanding of thermal variations within a particular chamber.

With information of power consumed by each integrated circuit under test and ambient temperature, the junction temperature of each integrated circuit under test can be determined using Relation 1, above. If the computed junction temperature is not the desired junction temperature, test controller 350 can adjust the positive and/or negative body biases of each integrated circuit under test to increase or decrease threshold voltage, and thus leakage current, and consequently power consumption and in turn to achieve the desired junction temperature.

Figure 4:
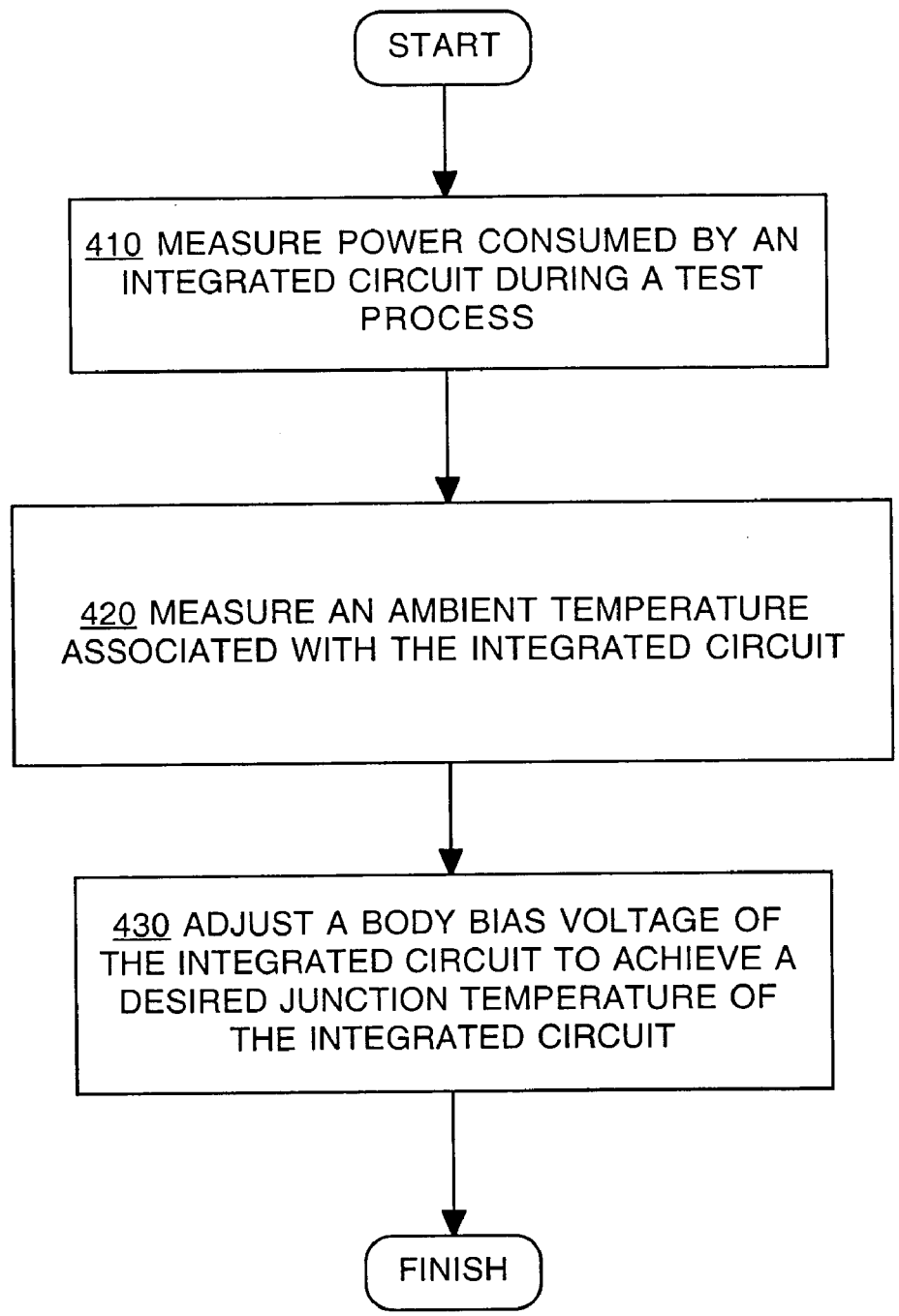
FIG. 4 illustrates a flow chart for a computer-implemented method of reducing power during burn in testing, in accordance with embodiments of the present invention.

FIG. 4 illustrates a flow chart for a computer-implemented method 400 of reducing power during burn in testing, in accordance with embodiments of the present invention. In block 410, power consumed by an integrated circuit during a test process is measured. For example, current and voltage to the integrated circuit can be measured.

In block 420, an ambient temperature associated with the integrated circuit is measured. The ambient temperature should be more closely associated with the integrated circuit than a "set point" of a temperature chamber. For example, the ambient temperature can be measured by a single ambient temperature sensor on a wiring board, e.g., wiring board 310 of FIG. 3, comprising an array of integrated circuits. Alternatively, the ambient temperature can be measured by an ambient temperature sensor in close proximity to the integrated circuit.

In block 430, a body bias voltage of the integrated circuit is adjusted to achieve a desired junction temperature of the integrated circuit. It is to be appreciated that body-biasing voltage can affect threshold voltages, which in turn affect leakage current which is a significant component of integrated circuit power consumption. By adjusting, e.g., increasing or decreasing, integrated circuit power consumption, the junction temperature of an integrated circuit can be directly manipulated. In combination with information of an ambient temperature of the integrated circuit, a desired junction temperature can be achieved.

In this novel manner, a junction temperature of an integrated circuit can be controlled without directly measuring the junction temperature of the integrated circuit. It is generally less complex and less expensive to measure ambient temperature than to directly measure junction temperature of an integrated circuit. Further, systems to measure power and control low current voltages are typically less complex and less expensive than creating individual thermal environments for large numbers of integrated circuits. As a beneficial result, embodiments in accordance with the present invention reduce temperature variation during burn in with much less cost, much less complexity and with greater reliability than the conventional practice.

Figure 5:
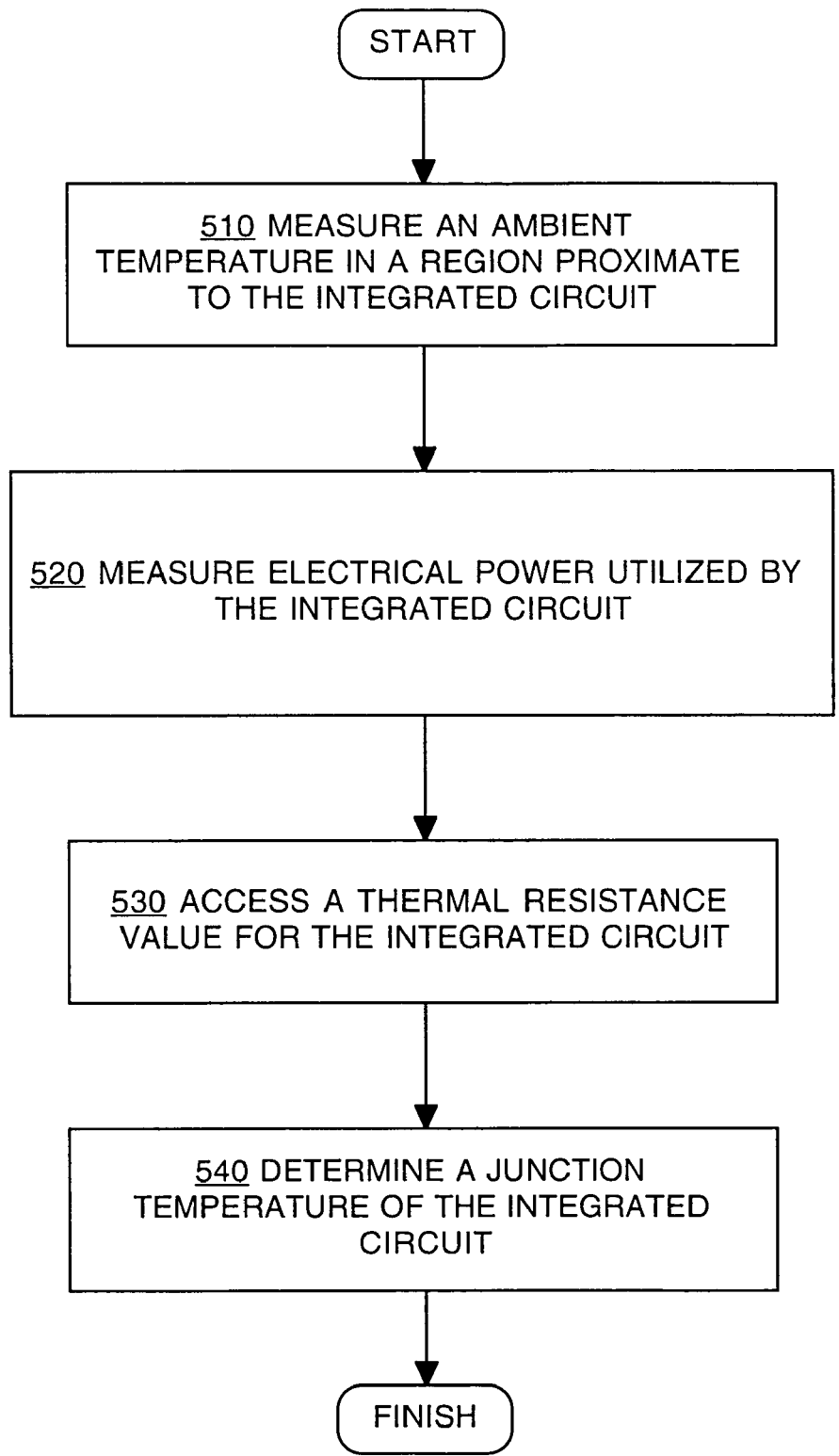
FIG. 5 illustrates a flow chart for a computer-implemented method of determining a junction temperature of an integrated circuit, in accordance with embodiments of the present invention.

FIG. 5 illustrates a flow chart for a computer-implemented method 500 of determining a junction temperature of an integrated circuit, in accordance with embodiments of the present invention. In block 510, an ambient temperature in a region proximate to the integrated circuit is measured. The ambient temperature sensing device should be in the same thermal conditions as the integrated circuit.

In block 520, electrical power utilized by the integrated circuit is measured. Typically, such measurement is performed by measuring voltage and current supplied to the integrated circuit.

In block 530, a thermal resistance value for the integrated circuit is accessed, for example, from computer memory. The thermal resistance value can be determined from packaging design information, but is typically measured during development of the integrated circuit and its packaging.

In block 540, a junction temperature of the integrated circuit is determined. For example, using power, ambient temperature and thermal resistance, junction temperature can be computed using Relation 1, above.

In this novel manner, a junction temperature of an integrated circuit can be determined without directly measuring the junction temperature of the integrated circuit. It is generally less complex and less expensive to measure ambient temperature than to directly measure junction temperature of an integrated circuit. Further, power utilized by an integrated circuit can be measured in a straightforward manner. Beneficially, embodiments in accordance with the present invention determine a junction temperature of an integrated circuit in a less costly and less complex manner than under the conventional art.

Embodiments in accordance with the present invention, system and method for reducing temperature variation during burn in, are thus described. While the present invention has been described in particular embodiments, it should be appreciated that the present invention should not be construed as limited by such embodiments, but rather construed according to the below claims.

What is claimed is:

1. A computer-implemented method of reducing temperature variation among integrated circuits during burn-in testing, said method comprising:
   measuring power consumed by an integrated circuit under test;
   measuring an ambient temperature associated with said integrated circuit under test; and
   adjusting a body bias voltage of said integrated circuit under test to achieve a desired junction temperature of said integrated circuit under test.

2. The method of claim 1 wherein said ambient temperature is measured for a region comprising only said integrated circuit under test.

3. The method of claim 1 wherein said ambient temperature is measured for a region comprising more than one integrated circuits under test.

4. The method of claim 1 wherein said measuring power comprises measuring current to said integrated circuit under test.

5. The method of claim 1 wherein an operating voltage of said integrated circuit under test remains fixed during said measuring and said adjusting.

6. The method of claim 1 wherein said body bias voltage is individually controllable for said integrated circuit under test.

7. The method of claim 1 wherein said integrated circuit under test comprises body-biasing well structures to accept said body bias voltage.

8. A computer-implemented method of reducing temperature variation among integrated circuits during burn-in testing, said method comprising:
   accessing a measurement of power consumed by an integrated circuit under test;
   accessing a measurement of an ambient temperature associated with said integrated circuit under test; and
   adjusting a body bias voltage of said integrated circuit under test to achieve a desired junction temperature of said integrated circuit under test.

9. The method of claim 8 wherein said ambient temperature is measured for a region comprising only said integrated circuit under test.

10. The method of claim 8 wherein said ambient temperature is measured for a region comprising more than one integrated circuits under test.

11. The method of claim 8 wherein said measuring power comprises measuring current to said integrated circuit under test.

12. The method of claim 8 wherein an operating voltage of said integrated circuit under test remains fixed during said measuring and said adjusting.

13. The method of claim 8 wherein said body bias voltage is individually controllable for said integrated circuit under test.

14. The method of claim 8 wherein said integrated circuit under test comprises body-biasing well structures to accept said body bias voltage.

15. A system for testing an integrated circuit comprising:
an operating voltage supply for coupling said integrated circuit;
a current measuring device for coupling said integrated circuit for measuring operating current of said integrated circuit;
a body bias voltage supply for coupling said integrated circuit for providing a body bias voltage;
an ambient temperature sensor for determining an ambient temperature for a region proximate to said integrated circuit;
a test controller for coupling said integrated circuit and coupling said current measuring device, said bias voltage supply and said ambient temperature sensor, said test controller for implementing a method for reducing temperature variation among an integrated circuit during burn-in testing, said method comprising:
accessing a measure of power consumed by said integrated circuit;
accessing a measure of ambient temperature associated with said integrated circuit; and
adjusting said body bias voltage of said integrated circuit to achieve a desired junction temperature of said integrated circuit.

16. The system of claim 15 wherein said ambient temperature is measured for a region comprising only said integrated circuit.

17. The system of claim 15 wherein said ambient temperature is measured for a region comprising more than one integrated circuits under test.

18. The system of claim 15 said accessing a measure of power accessing a measure of current to said integrated circuit.

19. The system of claim 15 wherein an operating voltage of said integrated circuit is fixed.

20. The system of claim 15 wherein said body bias voltage is individually controllable for said integrated circuit.

21. The system of claim 15 wherein said integrated circuit comprises body-biasing well structures to accept said body bias voltage.

22. The system of claim 15 wherein said method implemented by said test controller also comprises stimulating said integrated circuit for testing.

23. A computer usable media comprising computer usable instructions which when executed on a processor implement a method for reducing temperature variation among integrated circuits during burn-in testing, said method comprising:
measuring power consumed by said integrated circuit under test;
measuring an ambient temperature associated with said integrated circuit; and
adjusting said body bias voltage of said integrated circuit to achieve a desired junction temperature of said integrated circuit.

24. The media of claim 23 wherein said ambient temperature is measured for a region comprising only said integrated circuit.

25. The media of claim 23 wherein said ambient temperature is measured for a region comprising more than one integrated circuits under test.

26. The media of claim 23 wherein said measuring power comprises measuring current to said integrated circuit.

27. The media of claim 23 wherein an operating voltage of said integrated circuit is fixed.

28. The media of claim 23 wherein said body bias voltage is individually controllable for said integrated circuit.

29. The media of claim 23 wherein said integrated circuit comprises body-biasing well structures to accept said body bias voltage.

* * * * *